(12) United States Patent
Ramaraju et al.

(10) Patent No.: US 8,914,712 B2
(45) Date of Patent: Dec. 16, 2014

(54) HIERARCHICAL ERROR CORRECTION

(75) Inventors: Ravindraraj Ramaraju, Round Rock, TX (US); Ajay J. Joshi, Lexington, MA (US); Bobak A. Nazer, Brookline, MA (US)

(73) Assignee: Freescale Semiconductor, Inc., Austin, TX (US)

( * ) Notice: Subject to any disclaimer, the term of this patent is extended or adjusted under 35 U.S.C. 154(b) by 180 days.

(21) Appl. No.: 13/405,965

(22) Filed: Feb. 27, 2012

(65) Prior Publication Data
US 2013/0227368 A1 Aug. 29, 2013

(51) Int. Cl.
*H03M 13/00* (2006.01)
*H03M 13/09* (2006.01)

(52) U.S. Cl.
CPC ............. *H03M 13/00* (2013.01); *H03M 13/09* (2013.01)
USPC .......................................... 714/776; 714/767

(58) Field of Classification Search
CPC ... H03M 13/00; H03M 13/09; H03M 13/096; G06F 11/00; G06F 11/08; G06F 11/102; G06F 11/1044
USPC ................................. 714/767, 776
See application file for complete search history.

(56) References Cited

U.S. PATENT DOCUMENTS

| | | | |
|---|---|---|---|
| 3,685,014 A | 8/1972 | Hsiao et al. | |
| 4,236,247 A | 11/1980 | Sundberg | |
| 5,058,116 A | 10/1991 | Chao et al. | |
| 5,383,205 A | 1/1995 | Makihara et al. | |
| 5,793,693 A | 8/1998 | Collins et al. | |
| 6,480,975 B1 | 11/2002 | Arimilli et al. | |
| 6,622,260 B1 | 9/2003 | Marisetty et al. | |
| 6,662,333 B1 * | 12/2003 | Zhang et al. | 714/767 |
| 7,389,465 B2 | 6/2008 | Radke et al. | |
| 7,562,283 B2 | 7/2009 | Falik et al. | |
| 7,590,920 B2 | 9/2009 | Yang et al. | |
| 7,930,612 B2 | 4/2011 | Radke et al. | |
| 8,276,039 B2 | 9/2012 | Wuu et al. | |
| 2009/0222708 A1 | 9/2009 | Yamaga | |
| 2010/0223525 A1 * | 9/2010 | Wuu et al. | 714/755 |

FOREIGN PATENT DOCUMENTS

| | | |
|---|---|---|
| EP | 0107038 A2 | 5/1984 |
| WO | 03040922 A2 | 5/2003 |

OTHER PUBLICATIONS

Hsaio, M.Y., "A Class of Optimal Minimum Odd-weight-col. SEC-DED Codes," Jul. 1970, printed from <<http://www.cs.berkeley.edu/~culler/cs252-s02/papers/hsiao70.pdf>> on Nov. 3, 2011, pp. 395-401.

Kim, J. et al., "Multi-bit Error Tolerant Caches Using Two-Dimensional Error Coding," 40th IEEE/ACM International Symposium on Microarchitecture, 2007, pp. 197-209.

U.S. Appl. No. 13/045,307, filed Mar. 10, 2011, entitled "Hierarchical Error Correction for Large Memories".

(Continued)

*Primary Examiner* — Sam Rizk

(57) ABSTRACT

A data processing device can perform error detection and correction in two stages: in the first stage, error detection is performed for the load data using the in-line error detection information. If a first type of error is detected in the data segment, the error is corrected using the in-line error detection information. If a second type of error is detected error correction is performed using the residual sum.

19 Claims, 5 Drawing Sheets

(56) References Cited

OTHER PUBLICATIONS

Non-Final Office Action mailed Jun. 14, 2013 for U.S. Appl. No. 13/045,307, 24 pages.

Lu et al., "Architectural-Level Error-Tolerant Techniques for Low Supply Voltage Cache Operation," IEEE International Conference on IC Design & Technology, May 2-4, 2011; 5 pages.

Notice of Allowance mailed Oct. 28, 2013 for U.S. Appl. No. 13/045,307, 14 pages.

* cited by examiner

HIERARCHICAL ERROR CORRECTION

FIELD OF THE DISCLOSURE

The present disclosure relates to electronic devices, and more particular to data error correction for electronic devices.

BACKGROUND

In order to carry out their designated functions, electronic devices sometimes employ a processor that executes program instructions. In the course of carrying out the program instructions, the data processor stores and retrieves data from various memory devices, such as a processor cache. However, the electronic device is sometimes subject to conditions, such as environmental variations or hardware failure, that introduce errors in the data. Accordingly, electronic devices can employ error control modules to detect, and in some cases correct, the errors in data being retrieved from memory.

BRIEF DESCRIPTION OF THE DRAWINGS

The present disclosure may be better understood, and its numerous features and advantages made apparent to those skilled in the art by referencing the accompanying drawings.

DETAILED DESCRIPTION

FIGS. 1-5 illustrate techniques for detecting and correcting errors in load data being retrieved from a larger memory segment, such as a cache line. The load data is associated with two different types of error detection information: in-line error detection information determined based only on the load data and its parity bits (wherein load data is split into data segments and each data segments has its own parity bits), and a residual sum calculated based upon a finite field addition (e.g. an exclusive-OR operation) of all of the data at the memory segment (the memory segment data). Error detection and correction takes place in two stages: in the first stage, error detection is performed for the load data using the in-line error detection information. If a first type of error is detected in the data segment (e.g. a single bit error), the error is corrected using the in-line error detection information. If a second type of error is detected (e.g. an error in two bits of the data segment) error correction is performed using the residual sum. The properties of the residual sum allow for multi-bit error correction to be performed more efficiently, using less circuit area, than employing conventional in-line error correction information for each memory segment.

To illustrate, the two stage error correction can be performed for data being retrieved from a cache, wherein the cache includes a number of cache lines, and each cache line includes a set of ways. Each data segment in a cache line is associated with its own in-line error correction information (referred to as single-error-correct double-error-detect, or SEC-DED bits) sufficient to detect up to two errors in the bits of the way and correct a single bit error. In addition, for each cache line a residual sum is calculated, wherein the residual sum is a sum of the data segment bits of the cache line over a finite field. In response to a request to retrieve a cache way for provision to a data processor, the SEC-DED bits are used to detect errors in the cache way. When a two-bit error is detected, the residual sum is employed to correct the errors. In one embodiment, the residual sum can be combined directly with the data segments of the selected cache line in order to correct the errors. In other embodiments parity bits (referred to as double-error-correct triple-error-detect, or DEC-TED bits) sufficient to detect up to three errors in the bits of the cache line and correct a two-bit error are determined based on the residual sum. The DEC-TED bits are then employed to correct the two-bit error detected in the retrieved cache line.

Figure 1:
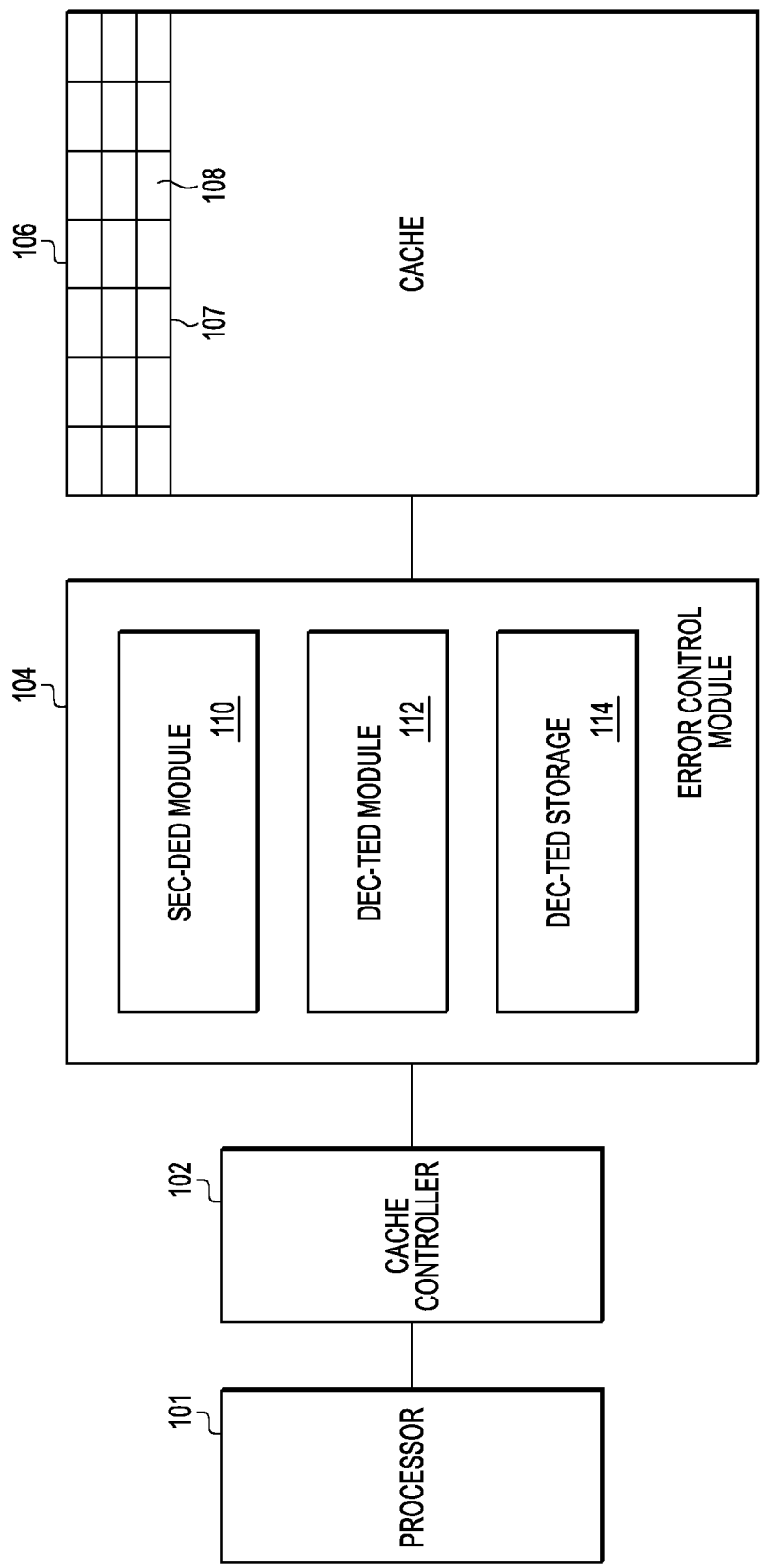
FIG. 1 is a block diagram illustrating portions of an electronic device in accordance with one embodiment of the present disclosure.

FIG. 1 illustrates a block diagram of a portion of an electronic device 100 in accordance with one embodiment of the present disclosure. The electronic device 100 can be any device that employs one or more data processors to perform designated tasks. Accordingly, the electronic device 100 can be incorporated in a computer, a phone, a vehicle such as an automobile, and the like. The electronic device 100 includes a processor 101, a cache controller 102, an error control module 104, and a cache 106. The electronic device 100 can also include additional modules (not shown), such as one or more data processors, communication modules, interconnects, input/output devices, and the like to facilitate performance of the device's designated tasks. The cache controller 102, error control module 104, and cache 106 each include logic gates, data storage elements, interconnects, and other elements connected to perform the modules' designated operations, as described further below.

The cache controller 104 is a module configured to receive load and store requests from the processor 101, wherein a load request represents a request to retrieve information (the load data) from a location designated by an address (the load address) and a store request represents a request to store information (the store data) designated by an address (the store address). In response to a load or store request, the cache controller 104 provides control signaling to execute the request. The cache controller 104 can also provide additional functionality, such as address translation, request arbitration, and the like, to facilitate execution of the load and store requests.

The error control module 104 is configured to perform error detection and correction operations in response to received control signaling associated with load and store requests. In particular, for a store request, the error control module 104 is configured to determine error detection and correction information based on the store data, including SEC-DED bits, residual sums of cache line data, and DEC-TED bits, as described further herein. For a load request, the error control module 104 is configured to detect and, if errors are detected, correct errors in load data.

To facilitate its error detection and correction operations, the error control module includes SEC-DED module 110, DEC-TED module 112, and DEC-TED storage module 114. SEC-DED module 110 is configured to perform operations associated with computation of SEC-DED bits based on store data, and perform error detection and correction on load data based on associated SEC-DED bits. DEC-TED module 112 is configured to perform operations associated with correction of two-bit errors in load data, including determination of residual sums and, in some embodiments, determination of DEC-TED bits or other error detection and correction information based on the residual sums. The DEC-TED storage module 114 is a set of storage elements configured to store information for use by the DEC-TED module 112, such as residual sums, DEC-TED bits, or other error detection and correction information. Although depicted as a separate memory for purposes of illustration, in one embodiment the DEC-TED storage module 114 is a part of the cache memory 106.

Cache 106 is a memory module configured to store information, and retrieve stored information, based on store and load requests respectively. The cache 106 is arranged according to a set of cache entries, such as cache entry 107, wherein each cache entry includes a set of ways, such as way 108. The cache 106 is configured to retrieve information at the granularity of a way. That is, in response to a load request, the cache 106 is configured to retrieve the information at the way indicated by the load address. In an embodiment, cache 106 can also store information at the granularity of a way. Each cache way includes at least two portions: a data portion that stores the data to be retrieved in response to a load request, and an error detection portion that stores SEC-DED bits associated with the data stored at the data portion. In an embodiment, each the data portion of each cache way is 64 bits (referred to as a double word), and each cache line includes 7 ways.

In operation, the cache controller 102 receives load and store requests from the processor 101. In response to a store request, the cache controller 102 provides the store data to the error control module 104 which determines SEC-DED bits based on the store data. The error control module 104 provides the store data and the associated SEC-DED bits to the cache 106 for storage at the way indicated by the store address.

As described further herein, the error control module 104 can also determine a residual sum for the cache line indicated by the store address. As used herein, a residual sum refers to a finite field sum of all data segments in a cache line. A finite field (also referred to as a Galois field) is a field containing a finite number of elements. Accordingly, a finite field sum of binary numbers can be calculated by combining the numbers according to an exclusive-OR (XOR) operation. In an embodiment, the residual sum for a store operation is determined by combining the all the data segments of the cache line associated with the store operation according to an XOR operation, resulting in a 64-bit residual sum. As described further herein, the properties of the residual sum are such that it can be employed to correct detected two-bit errors directly, or can be employed to determine error correction information which in turn is used to correct two-bit errors.

In response to a load request, the cache controller 102 provides the load address to the cache 106 via the error control module 104. In response, the cache 106 retrieves the load data from the data portion of the way indicated by the load address and also retrieves the SEC-DED bits associated with the load data. The SEC-DED module 110 performs error detection using the SEC-DED bits. If no errors are detected, the error control module 104 provides the load data to the cache controller 102 for provision the processor 101. If a single-bit error is detected, the SEC-DED module 110 corrects the error and provides the corrected load data to the cache controller 102. If a two-bit error is detected, the error control module 104 employs the residual sum associated with the cache line of the load data to correct the two-bit error. This can be better understood with reference to FIGS. 2-4.

Figure 2:
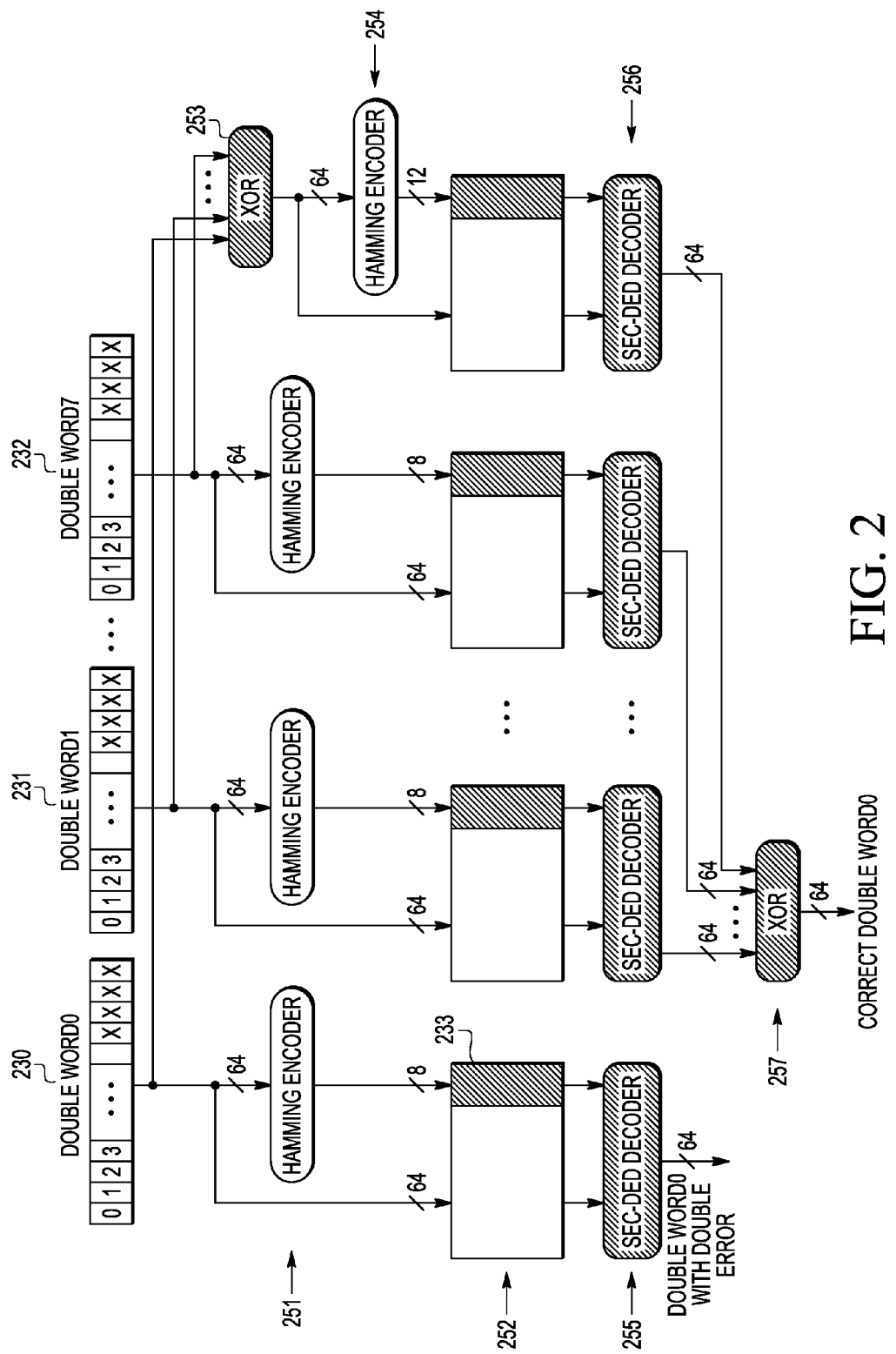
FIG. 2 is a diagram illustrating error correction at the electronic device of FIG. 1 in accordance with one embodiment of the present disclosure.

FIG. 2 illustrates a diagram of two-bit error correction at the data processing device 100 in accordance with one embodiment of the present disclosure. In particular, FIG. 2 illustrates a set of eight double words 230-232 of a 512 bit cache line which are each stored at a corresponding ways of cache entry 107. At stage 251 the SEC-DED module 110 determines SEC-DED bits for each of the double words 230-232 in response to corresponding store requests. It will be appreciated that stage 251, and each of the stages illustrated at FIGS. 2-4, can represent a set of events that take place over time. Thus, for example, stage 251 represents determination of the SEC-DED bits for each double word in response to a series of store requests received by the cache controller 102 over time. At stage 252, the double words 230-232 and their associated SEC-DED bits are stored at the corresponding data segments of a cache line. For example, double word 230 is stored at data segment 233 of a way in cache entry 107.

At stage 253 the residual sum for the double words is determined by the DEC-TED module 112 by combining all the double words according to an XOR operation. The resulting 64 bit residual sum is stored at the DEC-TED storage module 114. In an embodiment, the error control module 104 computes the residual sum for data stored at a cache line each time data is stored at a way of the cache line. Accordingly, the DEC-TED storage module 114 will store the most up-to-date residual sum for the data stored at each cache line of the cache 106.

At stage 254 the DEC-TED module 112 determines error detection information, such as SEC-DED bits, for the residual sum. The error detection information is stored with the residual sum at the DEC-TED storage module 114.

At stage 255, a load request for way 233 is received. In response, SEC-DED module 110 performs error detection for data retrieved from data segment 233, using the SEC-DED bits stored with the data segment. For purposes of illustration, it is assumed that the SEC-DED module 110 detects a two-bit error in the data segment retrieved from 233. In addition, for each data segment the SEC-DED module 110 performs in parallel error detection and, for single-bit errors, error correction using the corresponding SEC-DED bits, resulting in error corrected information for each data segment. Further, the SEC-DED module in parallel determines an error corrected residual sum by performing error detection and single-bit error correction for the residual sum associated with cache line, using the corresponding error control information stored at DEC-TED storage module 114.

At stage 257 the DEC-TED module 112 combines the corrected information from each data segment (other than data segment 233, for which the two-bit error has been detected) and the corrected residual sum according to an XOR operation. Because of the properties of the residual sum, the result of the XOR operation is a corrected representation of the double word 230. To illustrate, assume a residual sum Z is the result of combining data segments A, B, C, D, and E according to an XOR operation. The properties of the residual sum are such that combining B, C, D, E, and Z according to an XOR operation will yield the result A. Thus, if the data segment A is determined to have errors, an error free representation of data segment A can be recovered by combining B, C, D, E, and Z according to an XOR operation.

Figure 3:
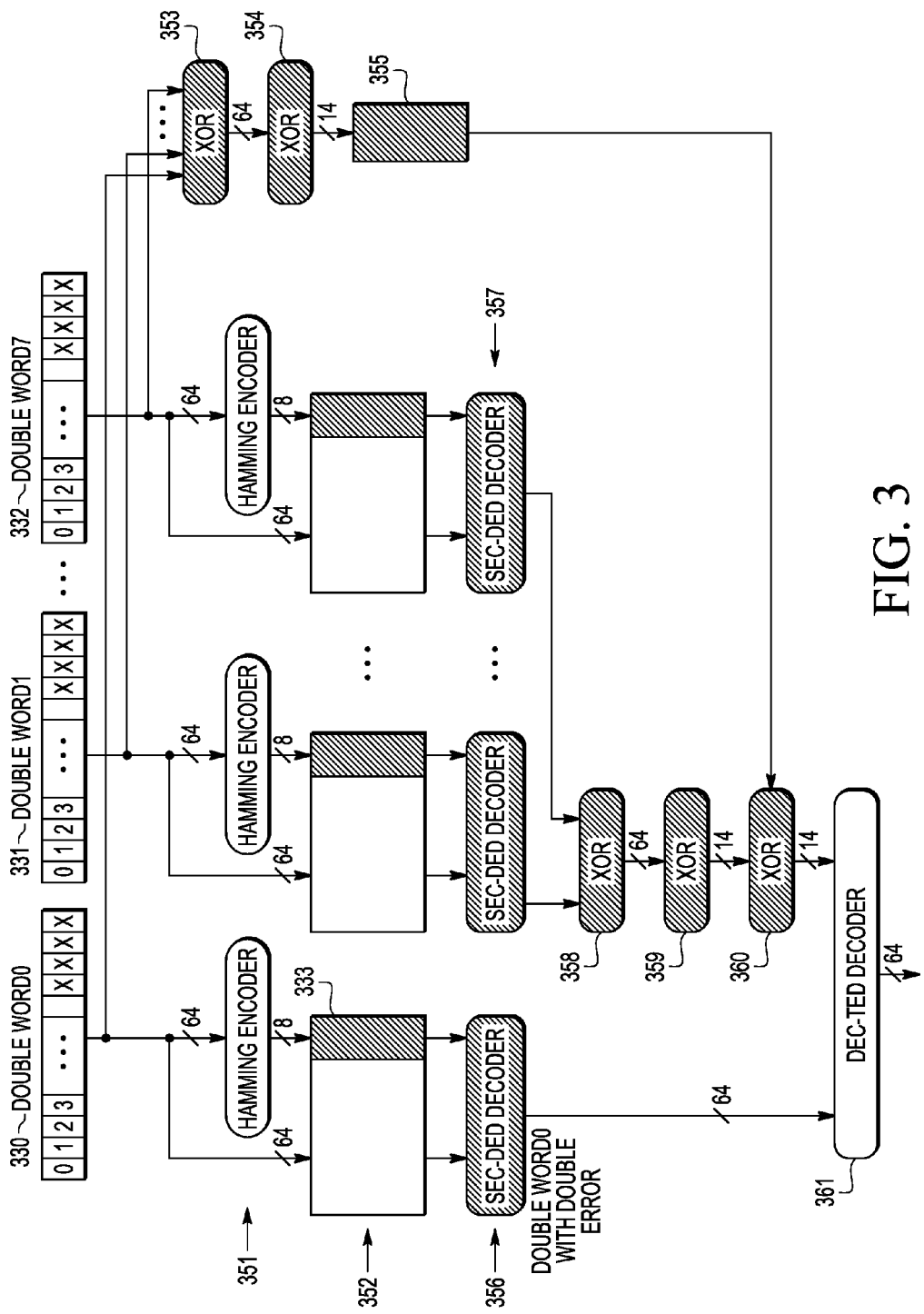
FIG. 3 is a diagram illustrating error correction at the electronic device of FIG. 1 in accordance with another embodiment of the present disclosure.

FIG. 3 illustrates a diagram of two-bit error correction at the data processing device 100 in accordance with one embodiment of the present disclosure. FIG. 3 illustrates a set of eight double words 330-332 of a 512 bit cache line which are each stored at a corresponding ways of cache entry 107. At stage 351 the SEC-DED module 110 determines SEC-DED bits for each of the double words 330-332 in response to corresponding store requests. At stage 352, the double words 330-332 and their associated SEC-DED bits are stored at the corresponding data segments of cache line. For example, double word 330 is stored at data segment 333 of a cache line in the cache entry 107.

At stage 353 the residual sum for the double words is determined by the DEC-TED module 112 by combining all the double words according to an XOR operation. At stage 354 the DEC-TED module 112 uses a parity matrix to determine DEC-TED parity bits for the residual sum. At stage 355 the parity bits are stored at DEC-TED storage module 114. In a preferred embodiment, the parity bits are stored in the cache 106 along with the associated cache line in the cache entry 107.

At stage 356 a load request for way 333 is received. In response, SEC-DED module 110 performs error detection for the data retrieved from data segment 333, using the SEC-DED bits stored at the way. For purposes of illustration, it is assumed that the SEC-DED module 110 detects a two-bit error. In addition for each data segment other than data segment 333, the SEC-DED module 110 performs in parallel error detection and, for single-bit errors, error correction using the corresponding SEC-DED bits, resulting in error corrected information for each data segment except data segment 333.

At stage 358 determines a residual sum for the error corrected information by combining the error corrected information according to an XOR operation. At stage 359 the DEC-TED module 112 uses a parity matrix to determine a set of parity bits based on the residual sum. In an embodiment, the DEC-TED module uses the same parity matrix as used at stage 354. At stage 360 the DEC-TED module 112 combines, according to an XOR operation, the parity bits associated with the residual sum of the cache line with the parity bits associated with the error corrected information for each way other than way 233. The result is a set of DEC-TED parity bits. Accordingly, at stage 361 the DEC-TED module 112 uses the DEC-TED parity bits produced at stage 360 to correct the double error for the data retrieved from data segment 333.

In an embodiment, one or more of the stages illustrated at FIG. 3 can increase the speed of the double error correction by performing operations in parallel. For example, in one embodiment, at stage 361 the DEC-TED module 112 uses the upper half of the parity bits provided by stage 360 to perform error correction on the upper half of the data retrieved from way 333 and, in parallel, uses the lower half of the parity bits provided by stage 360 to perform error correction on the lower half of the data retrieved from way 333.

Figure 4:
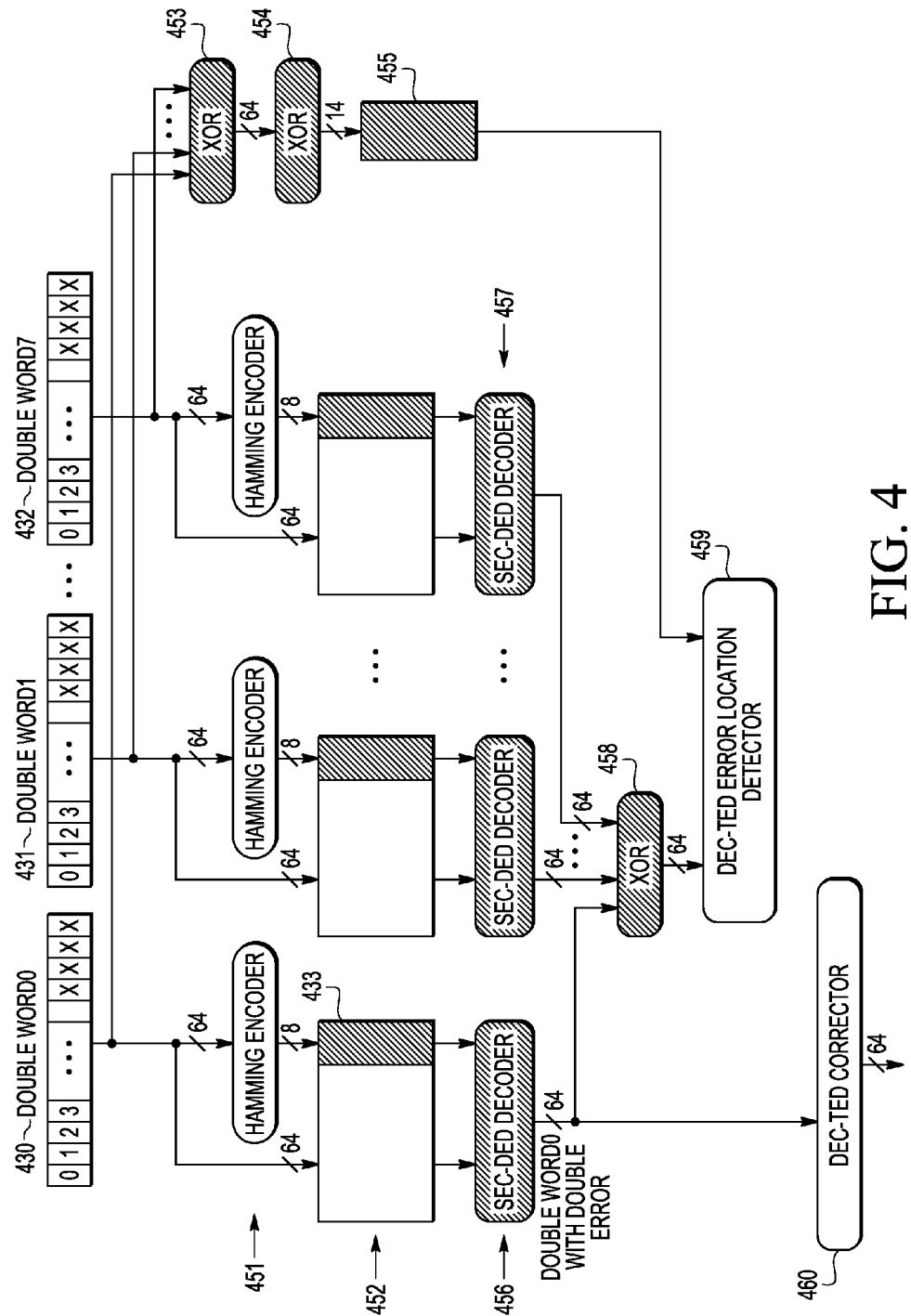
FIG. 4 is a diagram illustrating error correction at the electronic device of FIG. 1 in accordance with another embodiment of the present disclosure.

FIG. 4 illustrates a diagram of two-bit error correction at the data processing device 100 in accordance with one embodiment of the present disclosure. FIG. 4 illustrates a set of eight double words 430-432 of a 512 bit cache line which are each stored at corresponding data segments of a cache line in the cache entry 107. At stage 451 the SEC-DED module 110 determines SEC-DED bits for each of the double words 430-432 in response to corresponding store requests. At stage 452, the double words 430-432 and their associated SEC-DED bits are stored at the corresponding data segments of cache line. For example, double word 430 is stored at data segment 433 of cache line of the cache entry 107.

At stage 453 the residual sum for the double words is determined by the DEC-TED module 112 by combining all the double words according to an XOR operation. At stage 454 the DEC-TED module 112 uses a parity matrix to determine parity bits for the residual sum. At stage 455 the parity bits are stored at DEC-TED storage module 114.

At stage 456 a load request for way 433 is received. In response, SEC-DED module 110 performs error detection for the data retrieved from data segment 433, using the SEC-DED bits stored at the way. For purposes of illustration, it is assumed that the SEC-DED module 110 detects a two-bit error. In addition for each data segment, the SEC-DED module 110 performs in parallel error detection and, for single-bit errors, error correction using the corresponding SEC-DED bits, resulting in error corrected information for each data segment.

At stage 458 determines a residual sum is determined by combining the data retrieved from data segment 433 and the error corrected information from other data segments according to an XOR operation. At stage 459 the DEC-TED module 112 uses the retrieved corresponding parity bits of a cache line of the cache entry 107 determined at stage 454 and performs error detection on the residual sum determined at stage 458. Because of the properties of the residual sum, the error detection will indicate the bit positions of the erroneous bits of the data retrieved from data segment 433. Accordingly, at stage 460 the DEC-TED module 112 inverts the data at the corresponding bit positions of way 433, thereby correcting the data. For example, stage 459 can indicate that an error was detected at bit positions 5 and 18 of the residual sum determined at stage 458. Accordingly, at stage 460, the DEC-TED module 112 inverts the data at bit positions 5 and 18 of the data retrieved from way 433, thus correcting the data.

In an embodiment, one or more of the stages illustrated at FIG. 4 can increase the speed of the double error correction by performing operations in parallel. For example, in one embodiment, at stages 459 and 460 are performed in parallel. Thus, at stage 459 the DEC-TED module 112 uses the upper half of the parity bits provided by stage 454 to perform error detection on the upper half of the residual sum determined at stage 458 and, in parallel, uses the lower half of the parity bits provided by stage 454 to perform error detection on the lower half of the of the residual sum determined at stage 458.

Figure 5:
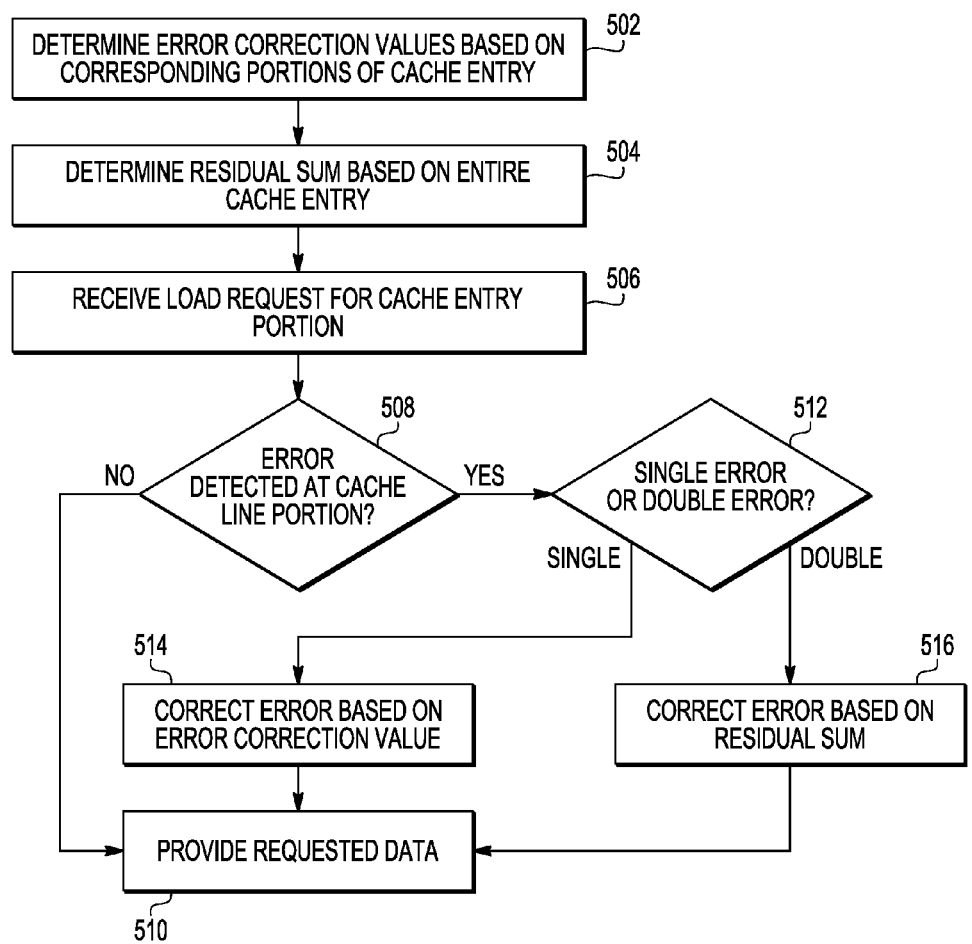
FIG. 5 is a flow diagram of a method of error correcting data in accordance with one embodiment of the present disclosure.

FIG. 5 illustrates a flow diagram of a method of performing error correction in accordance with one embodiment of the present disclosure. At block 502, the error control module 104 determines error correction values corresponding to each way of cache entry 107 based on the data stored at the corresponding way. At block 504, the error control module 104 determines a residual sum based on all of the data stored at the cache entry 107. At block 506, the cache controller 102 receives a read request for data stored at a selected one of the ways of cache entry 107. In response, at block 508, the error control module 104 determines, using the error correction value corresponding to the selected way, if an error is detected at the selected way. If no error is detected, the method flow proceeds to block 510 and the requested data is provided to the cache controller 102.

If an error is detected at block 508, the method flow proceeds to block 512 and the error control module 104 determines whether the detected error is a single-bit or double-bit error. In response to detecting a single bit error, the method flow moves to block 514 and the error correction module 104 corrects the error using the corresponding error correction value determined at block 502. The method flow proceeds to block 510 and the corrected data is provided to the cache controller 102.

If, at block 512, the error correction module 104 determines the error is a double-bit error, the method flow proceeds to block 516 and the error correction module 104 corrects the error using the residual sum for the cache entry 107 determined at block 504. The method flow proceeds to block 510 and the corrected data is provided to the cache controller 102.

It can be appreciated from the operational description of a hierarchical error correction of a cache line in a cache entry that the data segment of a cache line can be replaced with the way and all the operations described for data segments be applied over multiple ways of a cache entry. And also can be noted that the operational description is not limiting to data segments of a particular way but can be performed over data sets in a cache entry, wherein the data sets might be interleaved as way or column.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
   determining a first residual sum by performing, by a data processor device, an XOR operation-having operands of a first data segment and a second data segment, each one of the residual sum, the first data segment, and the second data segment having a predetermined number of bits;
   subsequent to determining the first residual sum detecting an error in the first data segment; and
   in response to detecting the error, correcting the error, by the data processor device, based on the second data segment and the first residual sum.

2. The method of claim 1, wherein correcting the error comprises:
   determining a corrected representation of the first data segment by determining a finite field sum of the second data segment and the first residual sum.

3. The method of claim 2, wherein correcting the error comprises:
   determining an error correction value based on the first residual sum; and
   performing error detection on the first residual sum based on the error correction value.

4. The method of claim 1, wherein correcting the error comprises:
   determining a first error correction value based on the first residual sum;
   determining a second residual sum comprising a finite field sum of the second data segment and a third data segment;
   determining a second, error correction value based on the second residual sum and the first error correction value; and
   determining a corrected representation of the first data segment based on the second error correction value.

5. The method of claim 4, wherein determining the second error correction value comprises:
   determining a third error correction value based on the second residual sum; and determining the second error correction value based on a combination of the third error correction value with the second error correction value.

6. The method of claim 1, wherein correcting the error comprises:
   storing the second data segment at a memory location;
   determining an error correction value based on the first residual sum;
   determining a second residual sum based on uncorrected data retrieved from the memory location;
   determining error locations based on the error correction value and the second residual sum; and
   determining a corrected representation of the first data segment by changing values of bits of the first data segment at locations corresponding to the error locations.

7. The method of claim 1, wherein correcting the error comprises:
   determining a first error correction value based on the first residual sum;
   determining a second residual sum comprising a finite field sum of the second data segment and a third data segment;
   determining a second error correction value based on the second residual sum and the first error correction value; and
   determining in parallel a corrected representation of a first portion of the first data segment based on a first portion of the second error correction value and a corrected representation of a second portion of the first data segment based on a second portion of the second error correction value.

8. The method of claim 1, wherein correcting the error comprises:
   storing the first data segment and the second data segment at a memory location;
   determining an error correction value based on the first residual sum;
   determining a second residual sum based on uncorrected data retrieved from the memory location;
   determining in parallel first error locations based on a first portion of the error correction value and a first portion of the second residual sum and second error locations based on a second portion of the error correction value and a second portion of the second residual sum; and
   determining in parallel a corrected representation of the first data segment by changing values of bits of a first portion of the first data segment at locations corresponding to the first error locations and changing values of bits of a second portion of the second data segment at locations corresponding to the second error locations.

9. The method of claim 1, wherein comprises a cache line of a cache comprises the first data and the second data segment.

10. A method, comprising:
    in response to detecting, by a data processor device, a first type of error at a first data segment, correcting the error, by the data processor device, based on a first error correction value; and
    in response to detecting, by the data processor device, a second type of error at the first data segment, correcting the error, by the data processor device, based on a first residual sum, the first residual sum determined by performing an XOR operation having operands of the first data segment and a second data segment, each one of the first residual sum, the first data segment, and the second data segment having a predetermined number of bits.

11. The method of claim 10, wherein correcting the error based on the first residual sum comprises determining a logical combination of the first residual sum and a portion of the second data segment.

12. The method of claim 11, wherein determining the logical combination comprises combining the first residual sum and the second data segment according to an exclusive-OR operation.

13. The method of claim 10, wherein correcting the error based on the first residual sum comprises determining a logical combination of the first residual sum and the second data segment.

14. The method of claim 10, a cache line of a cache comprises the first and second data segments.

15. The method of claim 14, further comprising determining the first residual sum based on all data segments of the cache line.

16. A device, comprising:
a memory comprising a memory region configured to store a plurality of data segments; and
an error control circuit, coupled to the memory, and comprising:
a first error detection module configured to determine determining a first error correction value based on a first data segment of the plurality of data segments; and
a second error detection module configured to determine a first residual sum comprising of the result of an XOR operation having operands of the first data segment and a second data segment, the first residual sum, the first data segment, and the second data segment having a predetermined number of bits, and to, in response a first error being detected based on the first error correction value, correcting the error based on the first residual sum.

17. The device of claim 16, wherein the second error detection module is configured to select the second data segment and determine a corrected representation of the first data segment by determining a finite field sum of the second data segment and the first residual sum.

18. The device of claim 16, wherein the second error detection module is configured to:
determine a second error correction value based on the residual sum;
select a subset of the plurality of data segments, the subset not including the first data segment;
determine a second residual sum comprising a result of an XOR operation having operands of the subset of the plurality of data segments;
determine a third error correction value based on the second residual sum and the second error correction value; and
determine a corrected representation of the first data segment based on the third error correction value.

19. The device of claim 16, wherein the second error detection module is configured to:
store the first data segment and the second data segment at a memory location;
determine a second error correction value based on the first residual sum;
determine a second residual sum based on uncorrected data retrieved from the memory location;
determine error locations based on the second error correction value and the second residual sum; and
determine a corrected representation of the first data segment by changing values of bits of the first data segment at locations corresponding to the error locations.

* * * * *